(12) United States Patent
Pessl

(10) Patent No.: US 7,183,850 B2
(45) Date of Patent: Feb. 27, 2007

(54) SWITCHABLE OPERATIONAL AMPLIFIER CIRCUIT

(75) Inventor: Peter Pessl, Nöstl/Welz (AT)

(73) Assignee: Infineon Technologies, AG, Munich (DE)

(*) Notice: Subject to any disclaimer, the term of this patent is extended or adjusted under 35 U.S.C. 154(b) by 22 days.

(21) Appl. No.: 10/488,814

(22) PCT Filed: Aug. 26, 2002

(86) PCT No.: PCT/EP02/09507

§ 371 (c)(1),
(2), (4) Date: Oct. 4, 2004

(87) PCT Pub. No.: WO03/023954

PCT Pub. Date: Mar. 20, 2003

(65) Prior Publication Data

US 2005/0035820 A1    Feb. 17, 2005

(30) Foreign Application Priority Data

Sep. 6, 2001    (DE) ............................... 101 43 770

(51) Int. Cl.
*H03F 3/45* (2006.01)
(52) U.S. Cl. ...................... 330/255; 330/258; 330/261
(58) Field of Classification Search ............... 330/253, 330/255, 258

See application file for complete search history.

(56) References Cited

U.S. PATENT DOCUMENTS

| 4,820,998 A | * | 4/1989 | Roessler et al. ............ 330/253 |
| 5,541,554 A |   | 7/1996 | Stengel et al. .............. 330/51 |
| 5,894,245 A |   | 4/1999 | Cho ........................... 330/253 |
| 5,923,216 A |   | 7/1999 | Pennock ..................... 330/255 |
| 6,373,337 B1 |  | 4/2002 | Ganser ....................... 330/252 |

FOREIGN PATENT DOCUMENTS

| DE | 695 17 706 T2 | 10/2000 |
| EP | 0 806 080 B1  | 5/1995 |
| EP | 0 899 871 A1  | 8/1998 |
| EP | 1 067 679 A2  | 6/2000 |

* cited by examiner

Primary Examiner—Khanh Van Nguyen
(74) Attorney, Agent, or Firm—Maginot, Moore & Beck

(57) ABSTRACT

An amplifier circuit in particular configured as an operational transconductance amplifier has signal paths switched in parallel to the individual transversal branches or signal paths, which can be alternatively activated and deactivated with the aid of suitable switching means (1, 2), so that without essentially changing the dynamic characteristics of the amplifier circuit switching over is possible by activating these parallel-switched additional signal paths or the transistors (M3.2–M12.2) contained in these from normal operation (A) into an operation (B) with, for example, a higher clock frequency in comparison to normal operation or for operating with higher loads in comparison to normal operation.

17 Claims, 3 Drawing Sheets

SWITCHABLE OPERATIONAL AMPLIFIER CIRCUIT

FIELD OF THE INVENTION

The present invention relates to the field of amplifier circuits, and more particularly to an operational transconductance amplifier (OTA).

BACKGROUND

Operational transconductance amplifiers can be used, for example, in any switched capacitor (SC) circuit, in particular in switched capacitor filters or in sigma delta analog/digital converters.

In FIG. 2 as an example a cascode operational transconductance amplifier is illustrated in accordance with the state of the art, whereby the example illustrated in FIG. 2 concerns in particular a fully differential "Folded cascode operational transconductance amplifier".

The operational transconductance amplifier shown in FIG. 2 comprises an input stage 10 with two transistors M1, M2, which form a differential pair. The gate terminals of the two differential pair transistors M1, M2 correspond to input terminals inp and inn, respectively, to which differential input signals are fed. The drain terminals of the differential pair transistors M1, M2 are linked with one another and connected to a serial circuit consisting of two further transistors M11, M12, which form a cascode circuit. The transistors M11, M12, through which a current $I_{ss}$ flows, thus form a power source for the differential pair transistors M1 and M2.

An output stage 20 is coupled with the input stage 10, said output stage comprising two output signal paths with a transistor M5 and M6, respectively, in each case serving as an amplifier element. The differential output signals corresponding to the amplified differential input signals can be picked up on the source terminals of these two transistors M5 and M6 via output signals outp and outn, respectively, since the drain terminals of the transistors M5 and M6 are connected to the source terminal of one of the differential pair transistors M1, M2. In addition, each output signal path has another transistor M3 and M4, respectively, whose source terminal is connected to the drain terminal of the transistor M5 and M6, respectively. The drain terminals of these two transistors M3, M4 are connected to a positive supply voltage $V_{DD}$, so that these two transistors M3, M4 function as a power source for the transistors M5 and M6, respectively. The source terminals of these two transistors M5 and M6 are again connected in each case to a series circuit consisting of transistors M9, M7 and M11, M8, respectively, via which the transistors M5 and M6, respectively, are connected to earth. The transistors M9, M7 and M10, M8 in each case form a cascode circuit and function as a power source for the transistors M5 and M6, respectively. With the example shown in FIG. 2, the gate terminals of the transistors M3 and M4, the transistors M5 and M6, the transistors M9 and M10 as well as the transistors M7 and M8 in each case are connected to one another and biased by an appropriate bias or pre-voltage $V_{bias1} \ldots V_{bias4}$. Furthermore, the bias voltage $V_{bias3} \ldots$ and/or $V_{bias4}$ also lies on the gate terminal of the transistor M11 and, respectively, on the gate terminal of the transistor M12.

In the case of the example illustrated in FIG. 2, the differential pair transistors M1, M2 as well as the transistors M7–M12 concern NMOS transistors, while the transistors M3–M6 concern PMOS transistors.

As already previously mentioned, such operational transconductance amplifiers are frequently used in sigma delta analog/digital converters, which are configured in accordance with the so-called switched capacitor technology. In this case, there is frequently a need to switch the sigma delta analog/digital converter for a particular operating mode to a higher clock frequency in comparison to the normal operating mode without changing the dynamic behaviour of the entire sigma delta analog/digital converter. Generally, such a problem can basically arise with any switched capacitor circuit.

In the case of the known operational transconductance amplifier circuit shown in FIG. 2, up to now the operating clock frequencies were switched over via changes in the bias voltage. For application in a sigma delta analog/digital converter it is necessary to switch over via the clock frequency in a wide range. When programming the particular operational transconductance amplifier via the bias voltages, however, this is not possible without reductions in performance. In this case, the dynamic characteristics, such as in particular the transit frequency and the phase reserve, of the operational transconductance amplifier would change too much. A further disadvantage when programming the operational transconductance amplifier via the bias voltages is that when switching over to the operating mode with the higher clock frequency the dynamic range of the operational transconductance amplifier is also affected. This results in greater nonlinear distortions, which in most applications are not desirable. Precisely with low voltage applications, as particularly in a sigma delta analog/digital converter, a change in the dynamic range of the operational transconductance amplifier is very disturbing.

The underlying object of the present invention is therefore to provide an amplifier circuit, which in the simplest way possible enables operation with various clock frequencies without changing the essential dynamic characteristics.

SUMMARY

According to the invention, it is proposed to switch in each case at least one further branch or signal path in parallel to the existing transversal branches of the amplifier circuit configured in particular as an operational transconductance amplifier. This relates in particular to the transversal branches or output signal paths of the output stage in the amplifier circuit. Preferably, at least one such parallel further input signal path is also provided for the transversal branch or input signal path of the input stage. By adding the respective further signal path the dynamic range of the amplifier circuit remains the same. Compared to reprogramming the amplifier circuit via the bias voltages described initially, this method has the advantage that not every transversal branch or signal path of the amplifier circuit has to be switched over to the same extent, that is to say the input stage can be configured independently of the output stage. Therefore it is possible to co-ordinate the parallel-switched additional signal paths better and thus to optimize the dynamic characteristics of the amplifier circuit. Furthermore, in this way energy loss can be very easily saved, which is not the case with switching over purely via the bias voltages.

The parallel-switched additional signal paths or transversal branches are built up symmetrically to and in accordance with those signal paths or transversal branches, to which they are connected in parallel, that is to say they contain the same type of components and are interconnected in a similar way. The additional signal paths are deactivated for normal operation of the amplifier circuit and activated for a second operating mode, for example with a clock frequency changed in comparison to normal operation, in particular a higher clock frequency, which preferably can be carried out with the aid of corresponding controllable switches. In order with such programming to avoid the need to have controllable switches in the signal paths for the parallel-switched additional signal paths, the parallel-switched signal paths are preferably switched over via the gate terminals of the respective transistors alternatively for activating to a corresponding bias voltage or for deactivating to a corresponding blocking voltage (dependent on the conductor type of the respective transistor in particular to the positive supply voltage or to earth). Since in the case of this embodiment the controllable switches do not lie in the corresponding signal paths, very small transistors with a minimum channel length can be used as controllable switches.

The parallel-switched additional signal paths or transversal branches of the amplifier circuit are structured—as has already been indicated—totally symmetrically to the respective existing signal path or transversal branch of the amplifier circuit, whereby this relates to both the input stage and the output stage of the amplifier circuit, so that no limitations in regard to the symmetry of the amplifier circuit in the layout result from the present invention.

Through the present invention therefore in principle two different layouts of an operational transconductance amplifier (or in the case of several parallel-switched additional signal paths or transversal branches more than two different layouts of an operational transconductance amplifier) are interlaced in a single operational transconductance amplifier circuit. Although this results in increased parasite problems, these can easily be compensated by the greater flexibility, due to the circuitry used through corresponding optimum layout of the parallel-switched additional signal paths.

The present invention is explained below in detail with reference to the appended drawing on the basis of a preferred embodiment. In this case, the present invention is explained in particular on the basis of a fully differential operational transconductance amplifier, whereby however the invention is naturally not limited to fully differential amplifier circuits, but can also be applied to amplifier circuits not configured differentially in a so-called "single ended" design. Equally, the present invention is explained below for the case that in the second operating mode, in which the additional signal paths are activated, operation with a higher clock frequency in comparison to normal operation should take place. Naturally, however, the invention is not limited to this preferred case of application but can generally be used for all cases, in which operation of the amplifier circuit under operating conditions different in comparison to normal operation should be possible. Thus, when adding and/or activating the additional signal paths, for example, operation with higher loads compared to normal operation etc. is also possible.

BRIEF DESCRIPTION OF THE DRAWINGS

In FIG. 1, a fully differential programmable "folded cascode operational transconductance amplifier" is illustrated, which is described below for the sake of simplicity as an operational transconductance amplifier.

DETAILED DESCRIPTION

Figure 1:
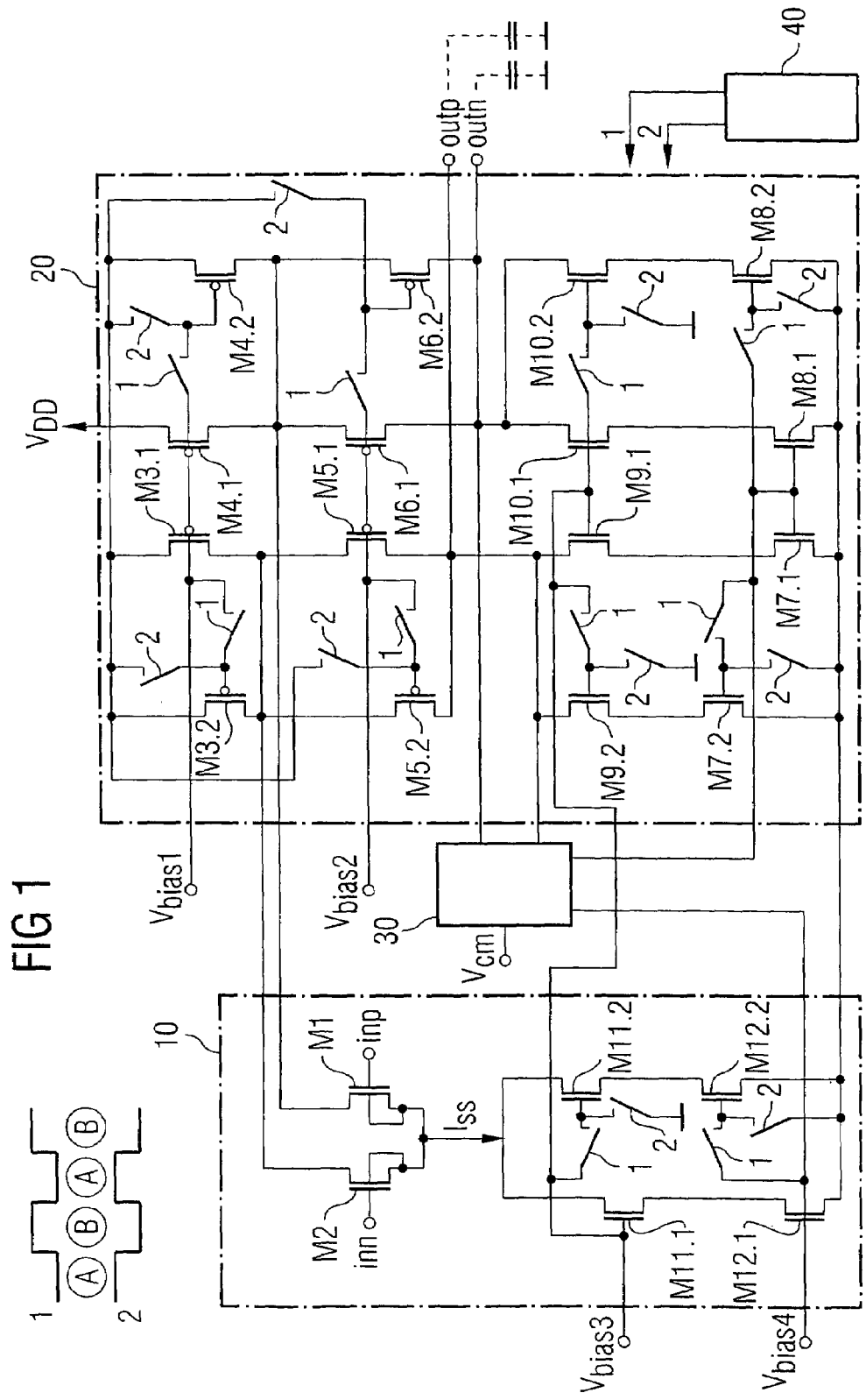
FIG. 1 shows an operational transconductance amplifier circuit in accordance with a preferred embodiment of the present invention.
Figure 2:
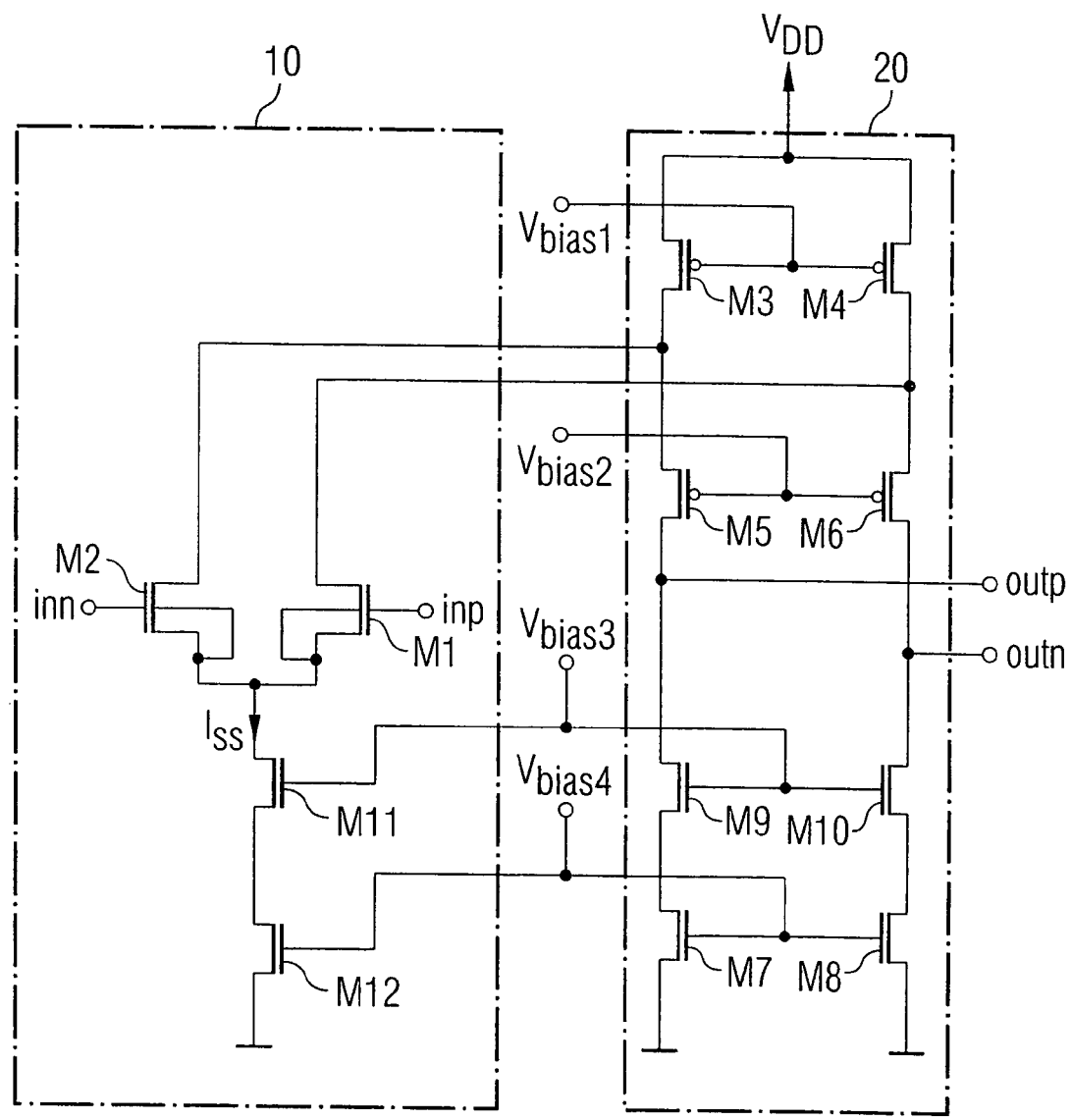
FIG. 2 shows an operational transconductance amplifier circuit in accordance with the prior art.

The structure of the operational transconductance amplifier shown in FIG. 1 is based on that of the operational transconductance amplifier shown in FIG. 2 and comprises an input stage 10 as well as an output stage 20. The input stage 10 similar to the operational transconductance amplifier shown in FIG. 2 has transistors M1, M2, which form a differential pair and at their gate terminals receive input signals inp and inn, respectively.

Transistors M11.1 and M12.1 which correspond to the transistors M11 and M12, respectively, shown in FIG. 2 are switched in series to the differential pair transistors and represent a power source for the current $I_{ss}$ of the differential pair transistors M1, M2. The output stage 20 similarly to the operational transconductance amplifier shown in FIG. 2 comprises two output signal paths with transistors M3.1–M10.1, which correspond to the transistors M3–M10 shown in FIG. 2, and are interconnected similarly to these transistors. The differential output signals outp and outn, respectively, can be picked up on the transistors M5.1 and M6.1, respectively, functioning as amplifier elements. Regarding the function of these elements, reference can be made to the previous explanations regarding the operational transconductance amplifier shown in FIG. 2.

In contrast to the operational transconductance amplifier shown in FIG. 2, however, in the case of the operational transconductance amplifier shown in FIG. 1 a further signal branch or signal path is switched in parallel to each transversal branch of the operational transconductance amplifier shown in FIG. 1. Thus, for example, a further output signal path with additional transistors M3.2, M5.2, M9.2 and M7.2 is switched in parallel to the output signal path with the transistors M3.1, M5.1, M9.1 and M7.1, which are interconnected similarly to the first transistors mentioned. Likewise a further output signal path with additional transistors M4.2, M6.2, M10.2 and M8.2, which are interconnected similarly to the transistors specified above, is switched in parallel to the output signal path with the transistors M4.1, M6.1, M10.1 and M8.1. Finally, a further input signal path with additional transistors M11.2 and M12.2 in the input stage 10 is also switched in parallel to the input signal path with the transistors M11.1 and M12.1, whereby the differential pair transistors M1, M2—as shown in FIG. 1—are provided jointly for these two input signal paths. The conductor types of the transistors contained in the parallel-switched signal paths in each case correspond to the conductor types of those transistors, to which they are switched in parallel. With the embodiment shown in FIG. 1, therefore, the transistors M3.1–M6.1 and M3.2–M6.2 are configured as PMOS transistors, while the transistors M7.1–M12.1 and M7.2–M12.2 are configured as NMOS transistors. The differential pair transistors M1 and M2 are likewise NMOS transistors.

The gate terminals of the additional transistors contained in the individual parallel-switched signal paths can be connected for activation in each case via controllable switches 1 to the respective bias voltage $V_{bias1}$–$V_{bias4}$ or via controllable switches 2 to a blocking voltage, through which the respective additional transistor is deactivated or blocked. The control signals for the controllable switches 1 and 2 are produced by a gate circuit 40, whereby dependent on the position of the controllable switches 1 and 2 in the case of the embodiment shown in FIG. 1 a distinction is made between two different operating modes of the operational transconductance amplifier. In normal operation (operating mode A), the controllable switches 2 are closed and the controllable switches 1 open, so that the gate terminals of the NMOS transistors contained in the parallel-switched additional signal paths are connected to the earth potential and the gate terminals of the PMOS transistors contained in the parallel-switched additional signal paths are connected to the positive supply voltage potential $V_{DD}$, as a result of which the respective transistors are deactivated. However, if the operational transconductance amplifier is to be operated with a higher clock frequency (operating mode B) in comparison to normal operation, the controllable switches 2 are open and the controllable switches 1 are closed, so that the gate terminals of the transistors contained in the parallel-switched additional signal paths are each connected to the appropriate bias voltage $V_{bias1}$–$V_{bias4}$ and are therefore activated and electrically connected.

Additionally in the case of the embodiment shown in FIG. 1, a common mode regulator 30 is provided, which in accordance with FIG. 1 is interconnected with the input stage 10 and the output stage 20. A standard switched capacitor common mode regulator, which is operated as a function of a voltage $V_{CM}$ lying on this, can be used as common mode regulator 30, so that it does not have to be discussed further at this point.

For the person skilled in the art, it is obvious that the circuit layout illustrated in FIG. 1 can also be modified so that all PMOS transistors are replaced by NMOS transistors and vice versa, if in addition the earth potential is swapped with the positive supply voltage potential $V_{DD}$. In particular, a PMOS input stage can also be used in place of the NMOS input stage 10 shown in FIG. 1, without changing the characteristics of the amplifier circuit as a result. If a PMOS input stage 10, which can be combined with the output stage 20 shown in FIG. 1, is used, the transistors M11.1, M11.2, M12.1, M12.2 are connected to the supply voltage potential $V_{DD}$ and excitation of the differential pair transistors M1, M2 changes in comparison to FIG. 1, whereby however the basic concept of the present invention explained above remains the same.

In the following, the most important characteristics of an operational transconductance amplifier are described in brief for comparing the operational transconductance amplifier shown in FIG. 1 with the conventional operational transconductance amplifier shown in FIG. 2.

The so-called slew rate SR, which corresponds to the rising speed of the output voltage of the operational transconductance amplifier, is dependent on the transverse current $I_{ss}$ in the input stage 10 as well as the external capacitive load $C_L$, which is indicated in FIG. 1 with a broken line, lying on the output terminals:

$$SR = \frac{I_{ss}}{C_L} \quad (1)$$

The transit frequency GBW, that is to say the frequency, at which the amplification A of the operational transconductance amplifier assumes the value zero, is linearly dependent on the transconductance $gm_1$ of the input stage:

$$GBW = \frac{gm_1}{(2\pi C_L)} \quad (2)$$

For reasons of stability, it is important that the so-called phase reserve $\phi_R$ of the open loop in the operational transconductance amplifier is large enough. For use in switched capacitor circuits it is necessary that for operation with a higher clock frequency the slew rate SR and the transit frequency GBW are changed to the same extent, while the amplification $A_0$ of the operational transconductance amplifier at a frequency f=0 as well as the phase reserve $\phi_R$ should remain almost equal.

The type of change-over between different clock frequencies of an operational transconductance amplifier explained above on the basis of FIG. 1 has already been tested in a sigma delta analog/digital converter, whereby the clock frequency in the operating mode B was doubled compared to normal operation A. The capacitive load CL at the output terminals of the operational transconductance amplifier remains the same in both operating modes. The characteristics listed in the following table resulted from the measurements:

|  | Operating mode A | Operating mode B |
| --- | --- | --- |
| Clock frequency | 8.883 MHz | 17.664 MHz |
| $A_0$ | 66 dB | 65 dB |
| GBW | 120 MHz | 230 MHz |
| $\psi_R$ | 55° | 55° |
| SR | 120 MV/s | 280 MV/s |
| Linearity at $2V_{pp}$ | HD2 = −85 dBc | HD2 = −84 dBc |
|  | HD3 = −78 dBc | HD3 = −76 dBc |

From the above table it is clear that in both operating modes the amplification AO (at a frequency f=0) and the phase reserve $\phi_R$ remain almost constant. The slew rate SR and the transit frequency GBW change in the operating mode B in comparison to normal operation A nearly to the same extent.

Figure 3:
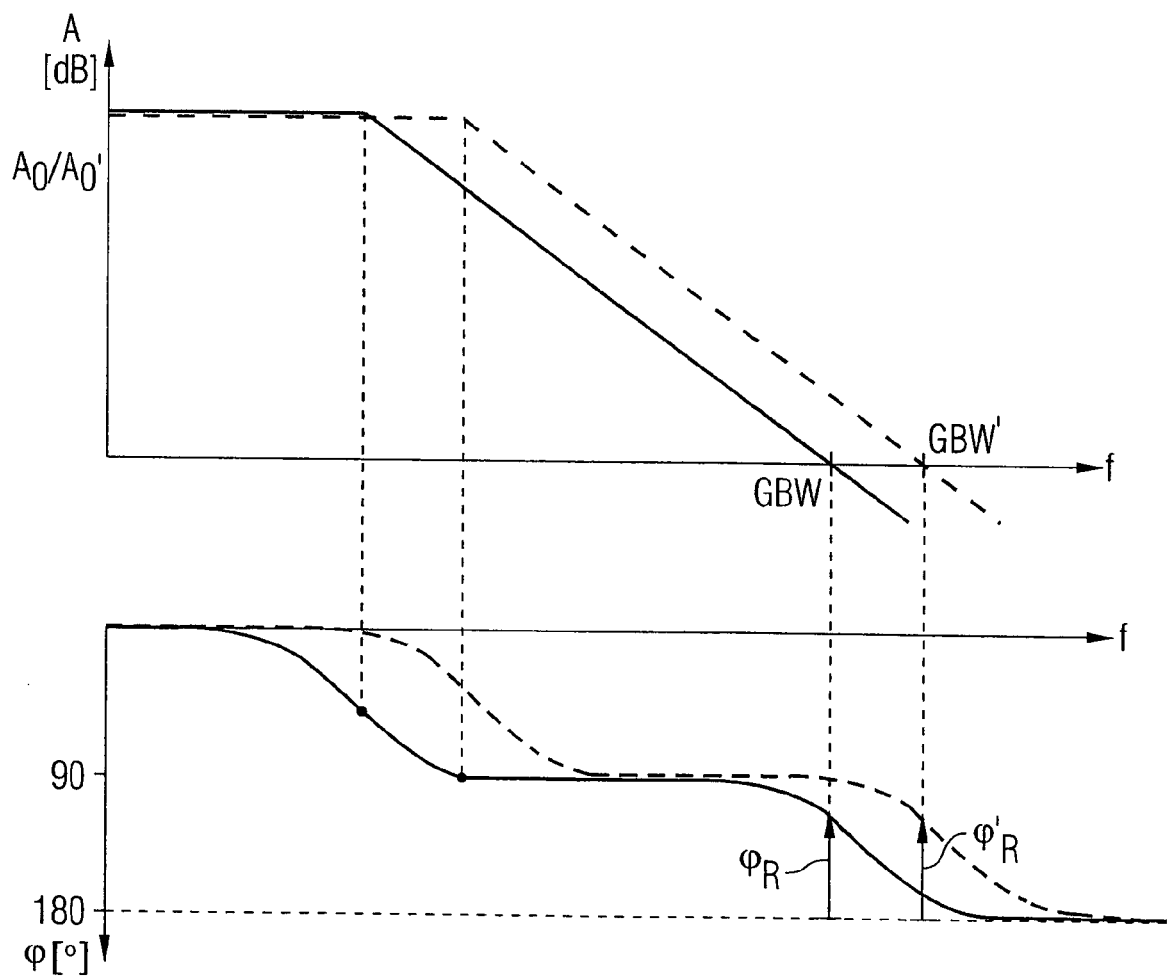
FIG. 3 shows the progression of the amplification and phase as a function of the operating clock frequency of the circuit shown in FIG. 1.

The measurement results can also be taken from the diagram illustrated in FIG. 3, whereby in the form of continuous characteristic lines the progress of the amplification A as well as the phase curve $\phi$ of the operational transconductance amplifier is illustrated as a function of the clock frequency f for normal operation, while broken lines in each case illustrate the progression for the operating mode with double the clock frequency f in comparison to normal operation. Also from FIG. 3 it is evident that the values for $A_0$ (normal operation) and $A_0'$ (operation at double clock frequency) are almost identical.

The same applies to the value of the phase reserve $\phi_R$ and/or $\phi_R'$ in the two operating modes.

The invention claimed is:
1. An amplifier comprising:
an input stage comprising
an input operably configured to receive an input signal,
a first input path operably connected to the input and comprising at least one transistor element,
a second input path comprising at least one transistor element, the second input path parallel to the first input path and operably connected to the input,
a first biasing voltage connection operably connected to the at least one transistor element of the first input path and switchably connected to the at least one transistor element of the second input path, and an input stage output operably connected to the first input path and to the second input path and configured to output the received input signal; and an output stage comprising a first output path operably connected to the input stage output and comprising at least one amplifier, a second output path comprising at least one amplifier, the second output path symmetrical to the first output path and operably connected to the input stage output, a second biasing voltage connection operably connected to the at least one amplifier of the first output path and switchably connected to the at least one amplifier of the second output path, and an output operably connected to the first output path and to the second output path and configured to output an amplified received input signal.

2. The amplifier of claim 1, wherein:

the at least one amplifier of the first output path comprises a control port, a first signal connection operably connected to the input stage output, and a second signal connection operably connected to the output stage output;

the at least one amplifier of the second output path comprises a control port, a first signal connection operably connected to the input stage output, and a second signal connection operably connected to the output stage output; and the output stage further comprises a first switch arrangement connected to the control port of the at least one amplifier of the second output path and switchable between a blocking voltage connection and the second biasing voltage connection such that when a second biasing voltage is applied to the second biasing voltage connection, and the first switch arrangement operably connects the blocking voltage connection, the second output path is deactivated and such that when a second biasing voltage is applied to the second biasing voltage connection and the first switch arrangement operably connects the second biasing voltage connection, the second output path is activated.

3. The amplifier of claim 2, wherein the control port of the at least one amplifier of the first output path is operably connected to the second biasing voltage connection.

4. The amplifier of claim 1, wherein the second output path further comprises:

a first transistor element having a control port and two signal connections, and wherein the output stage comprises:

a first switch arrangement, operably connected to the control port of the first transistor element of the second output path and switchable between the second biasing voltage connection and a blocking voltage connection such that when a second biasing voltage is applied to the second biasing voltage connection, and the first switch arrangement operably connects the blocking voltage connection, the first transistor element of the second output path is deactivated and such that when a second biasing voltage is applied to the second biasing voltage connection, and the first switch arrangement operably connects the second biasing voltage connection, the first transistor element of the second output path is activated.

5. The amplifier of claim 4, wherein the first output path further comprises:

a first transistor element having a control port and two signal connections, the control port of the first transistor element of the first output path operably connected to the second biasing voltage connection.

6. The amplifier of claim 1, wherein the at least one amplifier of the second output path comprises:

a control port;

a first signal connection operably connected to the input stage output; and a second signal connection operably connected to the output stage output, and wherein the output stage further comprises:

a first switch arrangement connected to the control port of the at least one amplifier of the second output path and switchable between the blocking voltage connection and the second biasing voltage connection such that when a second biasing voltage is applied to the second biasing voltage connection, and the first switch arrangement operably connects the blocking voltage connection, the second output path is deactivated and such that when a second biasing voltage is applied to the second biasing voltage connection, and the first switch arrangement operably connects to the second biasing voltage connection, the second output path is activated.

7. The amplifier of claim 4, wherein the second output path further comprises:

a second transistor element having a control port and two signal connections, and wherein the output stage comprises:

a second switch arrangement, operably connected to the control port of the second transistor element and switchable between the first biasing voltage connection and a blocking voltage connection such that when a first biasing voltage is applied to the first biasing voltage connection, and the second switch arrangement operably connects the blocking voltage connection, the second transistor element is deactivated and such that when a first biasing voltage is applied to the first biasing voltage connection, and the second switch arrangement operably connects to the first biasing voltage connection, the second transistor element is activated.

8. The amplifier of claim 7, wherein the first output path comprises a second transistor element having a control port, the control port of the second transistor element of the first output path operably connected to the first biasing voltage connection.

9. The amplifier of claim 7, wherein the at least one amplifier and the second transistor element of the second output path are operably connected in series between a first supply voltage connection and a second supply voltage connection, and wherein the blocking voltage connection is the second supply voltage connection.

10. The amplifier of claim 1, wherein the at least one transistor element of the second input path comprises a control port, the amplifier further comprising:

a first switch arrangement, operably connected to the control port of the at least one transistor element of the second input path and switchable between the first biasing voltage connection and a blocking voltage connection such that when a first biasing voltage is applied to the first biasing voltage connection, and the first switch arrangement operably connects the blocking voltage connection, the at least one transistor element of the second input path is deactivated and such that when a first biasing voltage is applied to the first biasing voltage connection, and the first switch arrangement operably connects the first biasing voltage connection, the at least one transistor element of the second input path is activated.

11. The amplifier of claim 10 wherein the at least one transistor element of the first input path comprises a control port, the first biasing voltage connection operably connected to the control port of the at least one transistor element of the first input path.

12. The amplifier of claim 10, wherein the at least one transistor element of the second input path is operably connected in series between the input and a second supply voltage connection, and wherein the blocking voltage connection is the second supply voltage connection.

13. The amplifier of claim 1, wherein:
the at least one transistor element of the first input path comprises a first transistor;
the first input path further comprises a second transistor connected in series with the first transistor;
the at least one transistor element of the second input path comprises a first transistor;
the second input path further comprises a second transistor connected in series with the first transistor;
the first output path further comprises a first, a second, and a third transistor operably connected in series with the at least one amplifier of the first output path; and
the second output path further comprises a first, a second, and a third transistor operably connected in series with the at least one amplifier of the second output path.

14. The amplifier of claim 1, wherein:
the at least one amplifier of the first output path comprises a first transistor;
the first output path further comprises a second transistor connected in parallel with the first transistor of the first output path;
the at least one amplifier of the second output path comprises a first transistor; and
the second output path further comprises a second transistor connected in parallel with the first transistor of the second output path.

15. The amplifier of claim 1, wherein:
the amplifier is a fully differential amplifier;
the input of the input stage comprises a first and a second input terminal, the first and the second input terminal configured to receive differential input signals;
the first output path comprises a first differential output path operably connected the first input terminal and a second differential output path operably connected to the second input terminal;
the second output path comprises a first differential output path operably connected the first input terminal and a second differential output path operably connected to the second input terminal; and
the output of the output stage comprises a first and a second output terminal, the first and the second output terminals configured to receive amplified differential input signals from the first and second differential output paths respectively of the first and second output paths.

16. The amplifier of claim 15, wherein the input stage comprises:
a first difference transistor operably connected to the first and the second input paths and having a control port, the control port comprising the first input terminal; and
a second difference transistor operably connected to the first and the second input paths and having a control port, the control port comprising the second input terminal.

17. The amplifier of claim 1, further comprising:
a first activating means operable to connect the first biasing voltage connection to the at least one transistor element of the second input path in response to a first control signal and operable to disconnect the first biasing voltage connection from the at least one transistor element of the second input path in response to a second control signal;
a second activating means operable to connect the second biasing voltage connection to the at least one amplifier of the second output path in response to a first control signal and operable to disconnect the second biasing voltage connection from the at least one amplifier of the second output path in response to a second control signal; and
a controller operably connected to the first and the second activating means and operable to generate a first control signal for a first mode of operation and a second control signal for a second mode of operation.

* * * * *